United States Patent [19]
Kushibiki et al.

[11] Patent Number: 4,871,411
[45] Date of Patent: Oct. 3, 1989

[54] METHOD OF PREPARING VOLUME TYPE HOLOGRAM FILM

[75] Inventors: Nobuo Kushibiki, Yamato; Yoko Yoshinaga, Machida; Naosato Taniguchi, Atsugi; Tetsuro Kuwayama, Yokohama, all of Japan

[73] Assignee: Canon Kabushiki Kaisha, Tokyo, Japan

[21] Appl. No.: 195,644

[22] Filed: May 18, 1988

[30] Foreign Application Priority Data

| May 21, 1987 | [JP] | Japan | 62-122419 |
| May 21, 1987 | [JP] | Japan | 62-122420 |
| May 21, 1987 | [JP] | Japan | 62-122421 |
| Oct. 30, 1987 | [JP] | Japan | 62-273349 |

[51] Int. Cl.$^4$ ............................................. B32B 31/18
[52] U.S. Cl. .................................... 156/249; 156/246; 156/344; 350/3.61; 430/2
[58] Field of Search ................ 156/246, 344, 249; 350/3.61; 430/2

[56] References Cited

U.S. PATENT DOCUMENTS

| 4,172,724 | 10/1979 | Matsumoto et al. | 350/3.61 |
| 4,201,441 | 5/1980 | Matsumoto et al. | 350/3.61 |
| 4,258,111 | 3/1981 | Matsumoto et al. | 430/2 |
| 4,287,277 | 9/1981 | Matsumoto et al. | 430/2 |

*Primary Examiner*—Robert A. Dawson
*Attorney, Agent, or Firm*—Fitzpatrick, Cella, Harper & Scinto

[57] ABSTRACT

A method of preparing a volume type phase hologram film comprises forming a volume type phase hologram in a polymer film formed on a substrate and comprises of a polymer of vinylcarbazoles, and separating the polymer film from the substrate. Preferably, the polymer film is separated from the substrate in a liquid inert to the hologram.

31 Claims, No Drawings

METHOD OF PREPARING VOLUME TYPE HOLOGRAM FILM

BACKGROUND OF THE INVENTION

1. Field of the Invention

The present invention relates to a method of preparing a volume type phase hologram film, and more particularly to a method of preparing a volume type phase hologram film having sufficient flexibility and further a superiority in high diffraction efficiency, high transparency and high moisture resistance, the method being capable of being used in various purposes.

2. Related Background Art

Holography is a unique technique of forming an optical image by which an object is irradiated by a well coherent wave such as a laser beem where the wave is modulated in amplitude and phase in accordance with the shape of the object, the modulated wave reflected upon or transmitted through the object is recorded (=hologram) and the hologram is irradiated again by the laser beam so as to reproduce an optical image of the original object.

With the recent development of study on holography, it has been made clear to a certain extent what material is suitable for use in holography or what characteristics such a hologram recording material should have.

Thus, there have already been proposed various materials such as bleached silver salt (U.S. Pat. No. 3,672,744), dichromate gelatine (U.S. Pat. No. 3,617,274), photoresist, thermoplastic resin, inorganic glass materials and ferroelectric substances, and at present a further study on the properties of these materials is proceeding in the art.

The properties which a hologram recording material (or sensitive material) should have may be summarized as follows:

(1) to have a sensitivity to a laser beam, especially to a laser beam in the visible wavelength region and to have a high sensitivity at the same time;
(2) to have a high resolving power;
(3) to give a hologram of high diffraction efficiency;
(4) to give a hologram of low noise level;
(5) to give a stable hologram; and
(6) to allow easy recording and reproducing operations.

As will be seen from the above, the requirements for a hologram recording material are very severe ones.

In view of practical purposes, very few known hologram recording materials can satisfy the above requirements completely or at least partially to the extent that its use may be practical.

Among the above mentioned materials, bleached silver salt and dichromate gelatine may be considered to be practically usable. However, they have particular disadvantages. The former necessitates a bleaching treatment in adition to ordinary treatments and furthermore the hologram obtained from it is poor in light fastness. The latter has a difficulty regarding the preservation of hologram because the hologram obtained from this material lacks adequate stability against moisture.

To overcome the disadvantages the conventional holograms have had, U.S. Pat. No. 4,287,277 discloses a hologram employing polyvinyl carbazole. This hologram employing polyvinyl carbazole is suitably used as it can satisfy the properties (1) to (6) mentioned above.

In general, volume type phase holograms are holograms in which a Bragg's grating is formed in the inside of a polymer and diffraction light wavelength is controlled by the grating distance (or grating space), where the grating pattern comprising several thousand or more lines is formed in a thickness of several ten $\mu m$ with a grating space of 0.1 to 0.2 $\mu m$. Therefore, at the time of manufacturing a volume type phase holograms (particularly at the time of exposure to laser beam), the exposure to laser beam must be carried out in a stationary state so that fluctuation may be suppressed within approximately 0.01 to 0.02 $\mu m$.

More specifically, at the time of the exposure to light, vibration, air-swirling caused by the passage of a laser beam, deformation of a holder of a sensitive material, thermal expansion, density gradient owing to temperature of air, etc. must be made sufficiently small. For the purpose a rigid and transparent material is used as a support for supporting the sensitive material, and in general usually used is glass.

However, the holograms for which glass is used as the support can be applied only to uses of very limited scope, such as displays or the like.

SUMMARY OF THE INVENTION

Accordingly, an object of the present invention is to overcome such disadvantages in the prior art to provide a technique of making the volume type phase hologram into a film, and to provide a method of preparing a volume type phase hologram film that can be applied in various uses such as optical coupling devices used in head-up displays and protectors for protecting eyes from a laser beam.

A further object of the present invention is to provide a method of preparing a volume type phase hologram film having a superiority in high diffraction efficiency, high moisture resistance and high transparency.

The above objects can be achieved by the invention described below.

According to one aspect of present invention, there is provided a method of preparing a volume type phase hologram film, comprising forming a volume type phase hologram in a polymer film formed on a substrate and comprised of a polymer of vinylcarbazoles, and separating said polymer film from said substrate.

According to another aspect of the present invention, there is provided a method of preparing a volume type phase hologram film, comprising forming a volume type phase hologram in a polymer film formed on a substrate and comprised on a polymer of vinylcarbazoles, and separating said polymer film from said substrate in a liquid inert to said hologram.

According to a further aspect of the present invention, there is provided a method of preparing a volume type phase hologram member, comprising forming a volume type phase hologram in a polymer film formed on a substrate and comprised of a polymer of vinylcarbazoles, thereafter separating said polymer film from said substrate, and bringing the polymer separated film to be supported on another substrate.

According to a still further aspect of the present invention, there is provided a method of preparing a volume type phase hologram member, comprising forming a volume type phase hologram in a polymer film formed on a substrate and comprised of a polymer of vinylcarbazoles, thereafter separating said polymer film from said substrate in a liquid inert to said hologram, and bringing the separated polymer film to be supported on another substrate.

DETAILED DESCRIPTION OF THE PREFERRED EMBODIMENTS

A typical embodiment of the present invention will be described below along the process.

First, a sensitive material layer comprised of a polymer of vinylcarbazoles as a principal component is formed on a light-transmissive substrate.

Utilizable as this light-transmissive substrate are substrates having the rigidity that may cause no vibration to occur owing to the irradiation of a laser beam, and having no remarkable absorption at the visible light region.

Particularly in regard to the light transmission properties, it is preferable to use a substrate having a light transmittance of 30% or more, preferably 50% or more, at 400 nm and also a light transmittance of 40% or more, preferably 80% or more, at 450 to 800 nm when the light transmittance is measured according to the method described in ASTM D-1003.

To exemplify the light-transmissive substrates used in the present invention, they may include a substrate made of glass, poly(4-methyl) pentene, polyvinyl chloride or the like, and, if necessary, the substrate having been made transparent by effecting drawing in the biaxial direction at the time of forming to cause orientation crystallization; and a substrate comprising an amorphous polymer such as polymethyl methacrylate, polycarbonate, polyallylate polyether ether ketone, polysulfone, a styrene/methyl methacrylate copolymer or acrylic acid polyhydric alcohol esters (CR-39).

It is also possible to use water soluble substrates in the case that the substrate is dissolved and removed in a solvent as described later.

For example, the water soluble substrates are formed from water soluble alkali halides as exemplified by sodium chloride, sodium bromide, potassium chloride, potassium bromide, etc. There is no particular limitation in the shape of the substrate comprised of these alkali halides, but it may preferably be in the shape of a flat sheet of approximately from 2 mm to 10 mm in thickness. The surface of the substrate on which the sensitive material layer is formed may be smooth or of any form including curved or uneven form, where a sensitive material layer of the form corresponding to its surface is formed.

In instances in which the exposure to light at the time of forming a hologram is carried out from the substrate side, the above substrates are required to be substantially transparent, but in instances in which the exposure to light is carried out from the sensitive material layer side, they may not necessarily be required to be transparent.

The surface of the photosensitive material layer formed on the transparent substrate and comprised of a polymer of vinylcarbazoles, may further be subjected to surface treatment as exemplified by an electrical discharge treatment using corona, plasma or the like, a physical treatment such as a flame treatment, a chemical treatment by use of sulfuric acid, nitric acid, fluoride compounds, alkalis, silane compounds, etc. for the purpose of enhancing the affinity for the photosensitive material layer so long as the peeling step described later in detail may not be hindered. It is necessary to carry out these treatments so as not to impair the required optical properties The photosensitive material layer formed on the transparent substrate and comprised of a polymer of vinylcarbazoles is used in the present invention as being superior in the overall aspects of moisture resistance, storage stability, diffraction efficiency, etc. of the resulting hologram itself.

This polymer of vinylcarbazoles polymer refers to polyvinyl carbazole, alkyl-substituted polyvinyl carbazoles, halogen-substituted polyvinyl carbazoles, and polymers comprised of these, and one or more of these can be used as desired. Specifically, there can be utilized, for example, polyvinyl carbazole, a 3-chlorovinyl carbazole polymer, a 3-bromovinyl carbazole polymer, a 3-iodoovinyl carbazole polymer, a 3-methylvinyl carbazole polymer, a 3-ethylvinyl carbazole polymer, chlorinated polyvinyl carbazole, brominated polyvinyl carbazole, etc.

In particular, suited for practical use is the unsubstituted polyvinyl carbazole, as being readily available and yet as being particularly superior in the performances of the resulting holograms.

The polymer of vinylcarbazoles may also be optionally copolymerized with other monomers for the purpose of controlling the properties such as strength or softness when formed into a film. Other monomers usable in such purpose may include, for example, in addition to the above vinyl carbazoles, vinyl monomers copolymerizable by radical polymerization, including vinyl esters such as vinyl acetate, esters of acrylic acid and methacrylic acid, styrene and styrene derivatives, etc. Other polymers as exemplified by polystyrene, a styrene/butadiene copolymer, a styrene/hydrogenated butadiene copolymer can also be used by blending so long as a hologram diffraction grating can be recorded.

These are used by selecting the proportion of addition so that the desired properties can be obtained.

In forming a hologram, the polymer of vinylcarbazoles is used in such a state that the polymer can be activated with radiation in the presence of an iodine compound.

Used as this iodine compound are compounds capable of coexisting in a polymer component to constitute a sensitive material layer having a sufficient sensitivity to the visible light wavelength, as exemplified by carbon tetraiodide, iodoform, ethylene tetraiodide, triiodoethane, tetraiodoethane, pentaiodoethane, hexaiodoethane, etc.

The formation of the photosensitive material layer comprised of the polymer of vinylcarbazoles on the transparent substrate may be carried out according to the coating method disclosed in U.S. Pat. No. 4,287,277.

Next, the photosensitive material layer is subjected to exposure to light and development processing to form the volume type phase hologram. The exposure to light may be in accordance with any of known photosensitive method, which may be appropriately selected depending on the type of objects, uses of holograms, etc. The exposure and development may be carried out, for example, according to the method disclosed in U.S. Pat. No. 4,287,277, etc.

More specifically, for example, an interference pattern is formed by exposure to two coherent laser beams, comprising the object beam and the reference beam, with use of an argon laser beam of (488 nm), and thereafter subjected to a development step comprising swelling and shrinking by using solvents.

The hologram obtained by such procedures may preferably have a thickness ranging from 4 to 20 μm. The thickness less than 4 μm may result in a lowering of the strength as a film, and the thickness otherwise more than 20 μm tends to cause cracking. The hologram may more preferably have a thickness ranging from 6 to 15 μm.

Next, the hologram obtained as above is dipped in a liquid inert to the hologram, so that a hologram layer in which the hologram diffraction grating has been recorded can be peeled from the substrate. This procedure makes it possible to obtain a hologram film without any destruction of the diffraction grating and further without causing any change in the optical properties possessed before treatment.

The liquid inert to the hologram, which is used to peel (or separate) the hologram layer from the substrate, refers to a liquid that may not dissolve the hologram layer, and that may penetrate into the interface between the both without impairing at all the optical properties of the hologram to bring them to peel from each other owing to a surface tension of the liquid, or to dissolve the substrate without exerting any action to the hologram layer.

The liquid used in such a step may be any of those that have the above properties and also may not substantially adversely affect the hologram-constituting component (especially the polymer of vinylcarbazoles polymer), but, in particular, water, alcohols and saturated hydrocarbons can be particularly suitably used, which may be appropriately selected depending on the material of the substrate used.

Preferable examples thereof are water and a mixed solvent of water with an organic low-boiling solvent, and the organic low-boiling solvent may include alkane or cycloalkanes such as n-heptane, n-hexane, Diflon (trade name; available from Daikin Kogyo), n-pentane, n-octane, iso-octane and cyclohexane, alcohols such as methyl alcohol, ethyl alcohol, propyl alcohol, isopropyl alcohol and n-butyl alcohol, ethers such as dimethyl ether and methyl ether, etc.

Application of a physical stimulation such as a moderate heating and ultrasonic treatment to water or a low-boiling solvent generally brings about an effective action for proceeding the peeling, showing a preferable tendency.

The peeled hologram film floats in the medium or on the medium, and can be readily taken out.

If in this peeling step it is predicted that practice of peeling by using the solvent is difficult (for example, if the hologram film may eventually have a small thickness and a low strength), it is preferably recommended that a peel layer first is laminated on the substrate in the first step and then the photosensitive material layer is laminated.

The peel layer mentioned in the present invention is used to make it easier to effect the peeling of the hologram film by use of the solvent.

Usable as the peel layer used for such a purpose is, for example, a layer comprised, for example, of a polymer, having a surface tension larger or smaller enough for obtaining a good peeling state than the surface tension of the hologram film 2 (30 to 40 dyne/cm when the polymer of vinylcarbazoles is used), or a layer comprised of a low-molecular surface improver called a silane coupling agent or titanium coupling agent.

Materials that can constitute the peel layer may specifically include, for example, polymers such as polyvinyl alcohol, polyvinyl pyrrolidone, polyethylene fluoride-propylene and polyorganosiloxane; silane coupling agents such as gamma-glycidoxypropyl trimethoxysilane and vinyl trimethoxysilane; titanium coupling agents such as isopropyltristearoyltitanate and isopropyltrioctyltitanate; etc.

The peel layer can be provided by laminating, for example, a layer comprising the above polymers on the substrate, or by treating the surface of the substrate with a solution containing the silane coupling agent or titanium coupling agent.

When peeled, the peel layer, if it is transparent, may remain on any of the substrate side and the hologram film side. when the peel layer remains on the hologram film side, it may be constituted of a material that functions as a protective layer of the hologram film, or various additives capable of imparting a protective function to the peel layer may be added.

Materials for forming the peel layer and capable of functioning also as the protective layer may include, for example, polyethylene terephthalate, polyether ether ketone, polyperfluoroethylene-propylene, polyvinylidene fluoride, polyvinyl alcohol, etc.

The additives that can be added to impart the function as the protective layer may include, for example, as an ultra-violet ray aboving agent, triazole derivatives such as 2-(hydroxyphenyl)benzotriazole, triazine derivatives such as 1,3,5-tris(2'-hydroxyphenyl)triazine, benzophenone derivatives such as resorcylmonobenzoate, etc.

If opaque, the peel layer may preferably be made to remain on the substrate side by suitably selecting the solvents.

In the case that the hologram itself has no supporting function, it is required to apply a flexible support. Then the hologram film taken out as mentioned above is scooped up with the flexible substrate (as exemplified by a polymer film).

The hologram comprising polyvinyl carbazole has a surface tension of 36 dyne/cm when measured according to the wetting test method described in JIS K6768. When the surface tension of the polymer film with which the hologram thrown into water and peeled and separated from the substrate is scooped up is found according to the above method, the hologram wrinkles or peels from the polymer film to curl in the case of the polymer film having the same surface tension as polyvinyl carbazole when it is scooped up and dried. On the other hand, when the polymer film having a value of 38 dyne/cm or more, more preferably 40 dyne/cm or more, is used, the adherence thereof to the hologram is so good that there is seen no wrinkle or curl of the hologram. The polymer film may be any of film showing no swell or dissolution in water or an organic low-boiling solvent, and the change in interfacial tension may not be required to be brought about by the change of the polymer film itself, but may be brought about by applying a physical treatment using corona, plasma, etc. or a chemical treatment using organic siloxane, epoxy, etc. to the surface of the polymer film.

There is a difference in the diffraction efficiencies measured respectively from the free surface (the surface having not come into contact with the substrate) of the hologram separated from the substrate in the liquid and from the surface having come into contact with the substrate. Accordingly, in order to obtain a hologram film having a higher diffraction efficiency, the polymer film should be supported so that it may come into contact with the free surface of the hologram.

Thickness of the hologram film thus obtained may preferably be in the range of from 10 $\mu$m to 200 $\mu$m, and suitably in the range of from 10 $\mu$m to 100 $\mu$m.

EXAMPLES

The present invention will be specifically described below by giving Examples.

EXAMPLE 1

On a washed glass substrate, a solution obtained by dissolving 2.5 g of N-polyvinyl carbazole and 0.2 g of carbon tetrachloride in 30 g of monochlorobenzene was applied in a dark place by means of a spinner (Mikasa Spinner, 1H-2), followed by drying to obtain a hologram-forming sensitive material layer of 8.9 $\mu$m in layer thickness.

Using an argon laser (488.0 nm), this sensitive material layer were irradiated with parallel beams from the opposite two directions of the sensitive material layer to effect exposure to light.

Thereafter the sensitive material layer was successively subjected to development processing according to the following steps (1) to (3), followed by drying to obtain a volume type phase hologram.

(1) Dipped in toluene for 2 minutes, 25° C.
(2) Dipped in xylene for 3 minutes, 25° C.
(3) Dipped in heptan for 3 minutes, 25° C.

The resulting hologram was left in water for 30 minutes to bring the hologram to peel from the glass substrate.

Subsequently, a polyester film (thickness: 50 $\mu$m) having a surface tension of 40 dyne/cm according to JIS K6768 was dipped in water to scoop up the hologram in such a manner that the hologram surface which had come into contact with the glass substrate may face the polyester film, followed by drying.

The volume phase hologram film thus obtained had a diffraction peak at 520 nm, a diffraction light half width of 18 nm, and a maximum diffraction efficiency of 95%. Also the transmittance at 600 nm showed 85%.

On the other hand, the hologram was scooped up in such a manner that the hologram surface which had not faced the glass substrate may face the polyester film, followed by drying.

The diffraction efficiency of the hologram film thus obtained reached 97% at its maximum, and thus the diffraction efficiency was higher than that of the hologram film previously obtained. There was seen no change in other properties of the holograms.

In any of the cases, the resulting films showed sufficient flexibility, had superior adherence between the hologram and the polyester film, and had superior film properties without causing the hologram to naturally peel from the polyester films or wrinkle.

EXAMPLE 2

Example 1 was repeated to prepare a hologram film, except that a biaxially oriented polypropylene film (thickness: 45 $\mu$m) having a surface tension of 42 dyne/cm was used in place of the polyester film used in Example 1. As a result, there were obtained the same results as in Example 1.

EXAMPLE 3

On a washed glass substrate, an N-polyvinyl carbazole sensitive material layer was formed in the same manner as in Example 1 except that the peel layer was provided by coating with an aqueous 7% solution of polyvinyl alcohol to a thickness of 2 $\mu$m by means of a spinner, followed by exposure to light and development processing.

The resulting laminated body was left in water for 10 minutes to bring the hologram to peel from the glass plate.

The two resulting holograms thus obtained were placed on the same polyester films as used in Example 1 to obtain two volume type phase hologram films. In one volume type phase hologram film, its hologram surface which had faced the glass substrate faced the surfaces of the polyester film, and in the other, its hologram surface which had not faced the glass surface faced the surface of the polyester film.

The holograms thus obtained had a diffraction peak half width of 18 nm and a transmittance of 81%. The diffraction efficiency was 82% for film on which the hologram was placed in such a manner that hologram surface which had faced the glass substrate may face the polyester film, and 89% for the other film.

There were also shown superior film properties like those in Example 1.

EXAMPLE 4

Trimethoxyvinylsilane (available from Shin-Etsu Chemical Co., Ltd.) was dissolved in ethyl alcohol to give a concentration of 5%, and a glass plate was dipped in the resulting solution for 1 hour, and thereafter allowed to stand in an oven of 80° C. for 4 hours.

On this glass substrate, the photosensitive material used in Example 1 was applied by means of a spinner to form a sensitive material layer of 20 $\mu$m thick.

Subsequently, using an argon laser (488 nm), irradiation of convergent light was carried out from one side of the sensitive material layer, and irradiation of parallel light was made from the other side opposite thereto to record a diffraction grating having a function of a convex lens.

Thereafter, this sensitive material layer was subjected to the development processing in the same manner as in Example 1 to obtain a volume type phase hologram.

The hologram obtained was left in methanol for 30 minutes to bring the hologram to peel from the glass plate, thus obtaining a volume type phase hologram film.

The resulting hologram film had a diffraction peak at 515 nm, and showed a maximum diffraction efficiency of 78%, a diffraction peak half width of 6 nm and a transmittance of 72%.

EXAMPLE 5

Example 4 was repeated to prepare a volume type phase hologram film, except that irradiations of argon laser beams (488 nm) were effected as parallel beams from the opposite two directions of the sensitive material layer to conduct exposure to light.

The hologram free surface and the hologram surface which had faced the glass substrate had diffraction efficiencies of 76% and 80%, respectively, and the hologram surface which had faced the glass substrate showed high diffraction efficiency at any of plural measurement points.

The width of the diffraction efficiency was found to be 5.9 nm, and the transmittance, 72%, being same in each hologram surface.

EXAMPLE 6

Bisphenol allylate resin substrate (TS-26, available from Tokuyama Soda Co., Ltd.) of 2 mm thick was washed with methanol, and the photosensitive material used in Example 1 was applied by means of a spinner to form a sensitive material layer of 7.6 μm thick.

Using an argon laser (488 nm), irradiation of convergent light was effected from one side of the sensitive material layer, and irradiation of parallel light was effected from the other side opposite thereto to record a diffraction grating having a function of a concave lens. This was subjected to the development and the substrate-peeling treatment in the same manner as in Example 1.

Thereafter the polyester film same as in Example 1 was dipped in water, and the hologram was scooped up in such a manner that the surface which had come into contact with the substrate may come into contact with the polyester film, followed by drying.

The volume type phase hologram film thus obtained had a diffraction peak at 520 nm and showed a half width of 19 nm, a diffraction efficiency of 96% and a transmittance of 86% at 600 nm, having the function of a concave lens.

EXAMPLE 7

Diethylene glycol bisacrylate resin substrate (TS-16, available from Tokuyama Soda Co., Ltd.) of 2 mm thick was washed with ethanol, and the solution of polyvinyl carbazole photosensitive material used in Example 1 was applied to the substrate by means of a spinner to form a sensitive material layer of 8.1 μm thick.

Irradiations of parallel beams from an argon laser (488 nm) were effected on the opposite two directions of this sensitive material layer to conduct exposure to light.

Subsequently, the resulting sensitive material layer was developed in the same manner as in Example 5, and thereafter dipped in a mixed solvent of water/methanol=7/3 to bring the hologram to peel from the resin substrate, and the hologram was scooped up with a polyester film having a surface tension of 45 dyne/cm, followed by drying.

Reflective diffraction efficiencies measured, when light was made incident from the respective surfaces of the hologram free surface at the time of exposure to light and the surface having come into contact with the resin substrate at the time of the exposure to light, were found to be 92% for the free surface and 97% for the surface having come into contact with the resin substrate.

As other properties of the hologram, the half width was found to be 19 nm, and the transmittance at 600 nm, 86%, being same in the above both surfaces.

EXAMPLE 8

On a sodium chloride crystal substrate (available from Nippon Bunko K.K.) of 5 mm thick, 30 mm diameter smooth on its surface, a solution obtained by dissolving 2.5 g of poly(N-vinyl carbazole) and 0.2 g of carbon tetrachloride in 30 g of monochlorobenzene was applied in a dark place by means of a spinner (Mikasa Spinner, 1H-2), followed by drying to obtain a hologram-forming sensitive material layer of 5.0 μm in layer thickness.

On this sensitive material layer, an image corresponding to a desired object was recorded according to the Denisyuk's method using an argon laser (488 nm) and under the condition of the offset angle of 70° and the light intensity ratio of 1:1 (the sum of light intensities of the both beams was 3 mW/cm² right before incidence of light).

After exposure to light, the sensitive material layer was successively processed according to the following steps (1) to (3) to obtain a hologram.

(1) Dipped in toluene of 20° C. for 2 minutes.
(2) Dipped in xylene of 30° C. for 3 minutes.
(3) Dipped in n-heptan of 25° C. for 3 minutes, followed by drying.

After development, the hologram plate was dipped in hot water of 80° C. for 60 minutes to dissolve the sodium chloride substrate in part, a hologram film was floated on water surface, and this was scooped up on a polyethylene terephthalate film having a surface tension of 40 dyne/cm, followed by washing with water and drying to obtain a volume type phase hologram film of the present invention.

EXAMPLE 9

On the substrate used in Example 8, the photosensitive material solution same as in Example 1 was applied to form a sensitve material layer of 8.0 μm thick, and irradiations of parallel beams from an argon laser (488 nm) were effected from the opposite two directions of the sensitive material layer to conduct exposure to light.

Development was carried out in the same manner as in Example 1, and the hologram was brought to peel from the substrate in the same manner as in Example 6.

Subsequently, on the polypropylene film (substrate) used in Example 2, the two holograms as obtained above were scooped up in such a manner that in one hologram its hologram free surface at the time of exposure to light and in the other hologram its surface having come into contact with the substrate may each face the substrate surface, followed by drying.

Light was made incident to each of the hologram free surface and the surface having come into contact with the sodium chloride substrate to measure the reflective diffraction efficiency to reveal that the reflective diffraction efficiency was 90% for the free surface and 92% for the sodium chloride substrate. The transmittance (600 nm) was found to be 83%.

We claim:

1. A method of preparing a volume type phase hologram film, comprising forming a volume type phase hologram in a polymer film formed on a substrate and comprised of a polymer of vinylcarbazoles, and separating said polymer film from said substrate in a liquid inert to said hologram.

2. The method of claim 1, wherein said hologram film has a thickness ranging from 4 to 20 μm.

3. The method of claim 1, wherein said substrate is light-transmissive.

4. The method of claim 1, wherein said substrate has a rigidity.

5. The method of claim 1, wherein said substrate is glass.

6. The method of claim 1, wherein said substrate has a light transmittance of 30% or more at 400 nm and 40% or more at 450 to 800 nm.

7. The method of claim 1, wherein said liquid is water or an organic low-boiling solvent, or a mixed liquid of these.

8. A method of preparing a volume type phase hologram member, comprising forming a volume type phase hologram in a polymer film formed on a substrate and comprised of a polymer of vinylcarbazoles, thereafter separating said polymer film from said substrate, and bringing the separated polymer film to be supported on another substrate.

9. The method of claim 8, wherein said polymer film has a thickness ranging from 4 to 20 μm.

10. The method of claim 8, wherein said substrate is light-transmissive.

11. The method of claim 8, wherein said substrate has a rigidity.

12. The method of claim 8, wherein said substrate is glass.

13. The method of claim 8, wherein said substrate has a light transmittance of 30% or more at 400 nm and 40% or more at 450 to 800 nm.

14. The method of claim 8, wherein said another substrate is a flexible substrate.

15. The method of claim 8, wherein said another substrate is a polymer film.

16. The method of claim 8, wherein said hologram member has a thickness ranging from 10 to 200 μm.

17. The method of claim 8, wherein said hologram member has a thickness ranging from 10 to 100 μm.

18. The method of claim 8, wherein said another substrate has a surface tension of 38 dyne/cm or more according to JIS K6768.

19. A method of preparing a volume type phase hologram member, comprising forming a volume type phase hologram in a polymer film formed on a substrate and comprised of a polymer of vinylcarbazoles, thereafter separating said polymer film from said substrate in a liquid inert to said hologram, and bringing the separated polymer film to be supported on another substrate.

20. The method of claim 19, wherein said polymer film has a thickness ranging from 4 to 20 μm.

21. The method of claim 19, wherein said substrate is light-transmissive.

22. The method of claim 19, wherein said substrate has a rigidity.

23. The method of claim 19, wherein said substrate is glass.

24. The method of claim 19, wherein said substrate has a light transmittance of 30% or more at 400 nm and 40% or more at 450 to 800 nm.

25. The method of claim 19, wherein said liquid comprises water or an organic low-boiling solvent, or a mixed liquid of these.

26. The method of claim 19, wherein said another substrate comprises a flexible substrate.

27. The method of claim 19, wherein said another substrate comprises a polymer film.

28. The method of claim 19, wherein said hologram member has a thickness ranging from 10 to 200 μm.

29. The method of claim 19, wherein said hologram member has a thickness ranging from 10 to 100 μm.

30. The method of claim 19, wherein said another substrate has a surface tension of 38 dyne/cm or more according to JIS K6768.

31. A method of preparing a volume type phase hologram film, comprising the steps of:
forming a volume type phase hologram in a polymer film on a substrate, said polymer film comprising a vinylcarbazole polymer;
separating said polymer film from said substrate; and
supporting said hologram on said substrate such that a surface of the hologram which was not previously in contact with said substrate subsequently contacts said substrate.

* * * * *

UNITED STATES PATENT AND TRADEMARK OFFICE
CERTIFICATE OF CORRECTION

PATENT NO. : 4,871,411
DATED : October 3, 1989
INVENTOR(S) : NOBUO KUSHIBIKI, ET AL.

It is certified that error appears in the above-identified patent and that said Letters Patent is hereby corrected as shown below:

On the title page:

IN [57] ABSTRACT

Lines 3-4, "comprises of" should read --comprises--.

COLUMN 1

Line 17, "well" should read --highly--.
    Line 18, "laser beem" should read --laser beam--.
    Line 56, "above mentioned" should read --above-mentioned--.
    Line 60, "adition" should read --addition--.

COLUMN 2

Line 10, "holograms" should read --hologram--.
    Line 42, "of present" should read --of the present--.
    Line 52, "comprised on" should read --comprised of--.

COLUMN 3

Line 8, "along" should read --along with--.

COLUMN 4

Line 16, "3-iodoovinyl" should read --3-iodovinyl--.
    Line 28, "usable in" should read --usable for--.

COLUMN 5

Line 45, "proceeding" should read --promoting--.

UNITED STATES PATENT AND TRADEMARK OFFICE
CERTIFICATE OF CORRECTION

PATENT NO. : 4,871,411

DATED : October 3, 1989

INVENTOR(S) : NOBUO KUSHIBIKI, ET AL.

It is certified that error appears in the above-identified patent and that said Letters Patent is hereby corrected as shown below:

COLUMN 6

Line 14, "when" should read --When--.
    Line 26, "aboving" should read --absorbing--.
    Line 54, "film" (second occurrence) should read --films--.

COLUMN 7

Line 20, "were" should read --was--.

Signed and Sealed this

Third Day of March, 1992

Attest:

HARRY F. MANBECK, JR.

*Attesting Officer*      *Commissioner of Patents and Trademarks*